United States Patent
Ibrahim et al.

(10) Patent No.: US 9,851,726 B2
(45) Date of Patent: Dec. 26, 2017

(54) THERMAL CAPACITY MANAGEMENT

(71) Applicant: Panduit Corp., Tinley Park, IL (US)

(72) Inventors: Mahmoud I. Ibrahim, Chicago, IL (US); Saurabh K. Shrivastava, Lemont, IL (US); Robert Wilcox, Monee, IL (US)

(73) Assignee: Panduit Corp., Tinley Park, IL (US)

( * ) Notice: Subject to any disclaimer, the term of this patent is extended or adjusted under 35 U.S.C. 154(b) by 661 days.

(21) Appl. No.: 14/474,496

(22) Filed: Sep. 2, 2014

(65) Prior Publication Data

US 2015/0066219 A1 Mar. 5, 2015

Related U.S. Application Data

(60) Provisional application No. 61/873,632, filed on Sep. 4, 2013.

(51) Int. Cl.
  G05D 23/19 (2006.01)
  G06F 1/20 (2006.01)
  H05K 7/20 (2006.01)

(52) U.S. Cl.
  CPC ......... *G05D 23/1917* (2013.01); *G06F 1/206* (2013.01); *H05K 7/20* (2013.01); *H05K 7/2079* (2013.01); *H05K 7/20836* (2013.01)

(58) Field of Classification Search
  None
  See application file for complete search history.

(56) References Cited

U.S. PATENT DOCUMENTS

| 6,754,816 B1 | 6/2004 | Layton et al. |
| 7,020,586 B2 | 3/2006 | Snevely |
| 7,061,763 B2 | 6/2006 | Tsoi |
| 7,065,740 B2 | 6/2006 | Westerinen et al. |
| 7,197,433 B2 | 3/2007 | Patel et al. |

(Continued)

FOREIGN PATENT DOCUMENTS

| WO | 2012047746 A2 | 4/2012 |
| WO | WO2013002754 A1 | 1/2013 |

OTHER PUBLICATIONS

Thermal Considerations in Cooling Large Scale High Compute Density Data Centers, Therm2002, The Eighth Intersociety Conference on Thermal and Thermomechanical Phenomena in Electronic Systems, San Diego, California, USA, Chandrakant D. Patel, Ratnesh Sharma, Cullen E. Bash and Abdlmonem Beitelmal, 10 pages, 2002.

(Continued)

*Primary Examiner* — Tuan Dao
(74) *Attorney, Agent, or Firm* — Christopher S. Clancy; James H. Williams; Ryan K. Thelen

(57) ABSTRACT

Embodiment of the present invention generally relate to the field of thermal capacity management within data centers, and more specifically, to methods and systems which provide feedback based on thermal information associated with parts of a data center. In an embodiment, the present invention is a method comprising the steps of using temperature measurements and power meter readings to provide real-time capacity usage information in a given data center and to use that information to perform moves/adds/changes with a particular level of confidence.

16 Claims, 3 Drawing Sheets

(56) References Cited

U.S. PATENT DOCUMENTS

| | | | |
|---|---|---|---|
| 7,210,048 B2 | 4/2007 | Bodas | |
| 7,213,065 B2 | 5/2007 | Watt | |
| 7,219,507 B1 | 5/2007 | Flachs | |
| 7,236,896 B2 | 6/2007 | Farkas et al. | |
| 7,426,453 B2 | 9/2008 | Patel et al. | |
| 7,523,092 B2 | 4/2009 | Andreev et al. | |
| 7,596,476 B2 | 9/2009 | Rasmussen et al. | |
| 7,606,014 B2 | 10/2009 | Ziegler et al. | |
| 7,619,868 B2 | 11/2009 | Spitaels et al. | |
| 7,642,914 B2 | 1/2010 | Campbell et al. | |
| 7,644,148 B2 | 1/2010 | Ranganathan et al. | |
| 7,669,431 B2 | 3/2010 | Bash et al. | |
| 7,676,280 B1 | 3/2010 | Bash et al. | |
| 7,739,388 B2 | 6/2010 | Wood | |
| 7,765,286 B2 | 7/2010 | Mark | |
| 7,769,843 B2 | 8/2010 | Neuse et al. | |
| 7,792,757 B2 | 9/2010 | Blumenau | |
| 7,805,473 B2 | 9/2010 | Ward | |
| 7,810,341 B2 | 10/2010 | Belady | |
| 7,818,499 B2 | 10/2010 | Arakawa et al. | |
| 7,832,925 B2 | 11/2010 | Archibald et al. | |
| 7,839,401 B2 | 11/2010 | Dillenberger et al. | |
| 7,861,102 B1 | 12/2010 | Ranganathan et al. | |
| 7,881,910 B2 | 2/2011 | Rasmussen et al. | |
| 7,885,795 B2 | 2/2011 | Rasmussen et al. | |
| 7,933,739 B2 | 4/2011 | Brey et al. | |
| 7,940,504 B2 | 5/2011 | Spitaels et al. | |
| 7,941,801 B2 | 5/2011 | Williams et al. | |
| 7,949,992 B2 | 5/2011 | Andreev et al. | |
| 7,958,219 B2 | 6/2011 | Collins et al. | |
| 7,971,446 B2 | 7/2011 | Clidaras et al. | |
| 7,975,165 B2 | 7/2011 | Shneorson et al. | |
| 7,979,250 B2 | 7/2011 | Archibald et al. | |
| 7,984,151 B1 | 7/2011 | Raz et al. | |
| 7,990,710 B2 | 8/2011 | Hellriegel et al. | |
| 7,991,592 B2 | 8/2011 | VanGilder et al. | |
| 8,041,967 B2 | 10/2011 | Belady et al. | |
| 8,046,468 B2 | 10/2011 | Isci et al. | |
| 8,046,765 B2 | 10/2011 | Cherkasova et al. | |
| 8,046,767 B2 | 10/2011 | Rolia et al. | |
| 8,053,926 B2 | 11/2011 | Lehmann et al. | |
| 8,094,452 B1 | 1/2012 | Carlson et al. | |
| 8,095,488 B1 | 1/2012 | Satish et al. | |
| 8,121,996 B2 | 2/2012 | Andreev et al. | |
| 8,122,149 B2 | 2/2012 | Ingle et al. | |
| 8,127,298 B2 | 2/2012 | Kato et al. | |
| 8,131,515 B2 | 3/2012 | Sharma et al. | |
| 8,140,195 B2 | 3/2012 | Matteson et al. | |
| 8,145,731 B2 | 3/2012 | Cherkasova et al. | |
| 8,171,142 B2 | 5/2012 | Kolin et al. | |
| 8,175,906 B2 | 5/2012 | Subrahmonia et al. | |
| 8,209,056 B2 | 6/2012 | Rasmussen et al. | |
| 8,224,993 B1 | 7/2012 | Brandwine | |
| 8,249,825 B2 | 8/2012 | VanGilder et al. | |
| 8,250,198 B2 | 8/2012 | Zhang et al. | |
| 8,260,921 B2 | 9/2012 | Uyama et al. | |
| 8,276,397 B1 | 10/2012 | Carlson et al. | |
| 8,286,442 B2 | 10/2012 | Carlson et al. | |
| 8,291,411 B2 | 10/2012 | Beaty et al. | |
| 8,306,794 B2 | 11/2012 | Hamann et al. | |
| 8,306,935 B2 | 11/2012 | Doorhy et al. | |
| 8,315,841 B2 | 11/2012 | Rasmussen et al. | |
| 8,332,670 B2 | 12/2012 | Kato | |
| 8,341,629 B2 | 12/2012 | Williams et al. | |
| 8,346,398 B2 | 1/2013 | Ahmed et al. | |
| 8,355,890 B2 | 1/2013 | VanGilder et al. | |
| 8,375,229 B2 | 2/2013 | Saeki | |
| 8,380,942 B1 | 2/2013 | Corddry et al. | |
| 8,386,995 B2 | 2/2013 | Coleman et al. | |
| 8,392,575 B1 | 3/2013 | Marr | |
| 8,392,928 B1 | 3/2013 | Forys et al. | |
| 8,395,621 B2 | 3/2013 | Tung et al. | |
| 8,397,088 B1 | 3/2013 | Ghose | |
| 8,401,833 B2 | 3/2013 | Radibratovic et al. | |
| 8,402,140 B2 | 3/2013 | Zhang et al. | |
| 8,411,439 B1 | 4/2013 | Carlson et al. | |
| 8,429,431 B2 | 4/2013 | Malik et al. | |
| 8,433,675 B2 | 4/2013 | Chavda et al. | |
| 8,438,125 B2 | 5/2013 | Tung et al. | |
| 8,457,938 B2 | 6/2013 | Archibald et al. | |
| 8,725,307 B2 | 5/2014 | Healey et al. | |
| 2003/0023885 A1 | 1/2003 | Potter et al. | |
| 2003/0126202 A1 | 7/2003 | Watt | |
| 2004/0023614 A1* | 2/2004 | Koplin | G06F 1/18 454/184 |
| 2005/0071092 A1 | 3/2005 | Farkas et al. | |
| 2006/0100744 A1* | 5/2006 | Sharma | F24F 11/0008 700/276 |
| 2007/0038414 A1 | 2/2007 | Rasmussen et al. | |
| 2007/0078635 A1 | 4/2007 | Rasmussen et al. | |
| 2007/0100685 A1 | 5/2007 | Brickhaus et al. | |
| 2007/0167125 A1 | 7/2007 | Rasmussen et al. | |
| 2007/0198383 A1 | 8/2007 | Dow et al. | |
| 2007/0250608 A1 | 10/2007 | Watt | |
| 2008/0140469 A1 | 6/2008 | Iqbal et al. | |
| 2009/0112522 A1 | 4/2009 | Rasmussen | |
| 2009/0138313 A1 | 5/2009 | Morgan et al. | |
| 2009/0150133 A1 | 6/2009 | Archibald et al. | |
| 2009/0164811 A1 | 6/2009 | Sharma et al. | |
| 2009/0296342 A1 | 12/2009 | Matteson | |
| 2009/0309570 A1 | 12/2009 | Lehmann et al. | |
| 2010/0111105 A1 | 5/2010 | Hamilton et al. | |
| 2010/0235662 A1 | 9/2010 | Nishtala | |
| 2011/0055390 A1 | 3/2011 | Malloy et al. | |
| 2011/0060561 A1 | 3/2011 | Lugo | |
| 2011/0077795 A1 | 3/2011 | VanGilder et al. | |
| 2011/0078479 A1* | 3/2011 | Vogman | G06F 1/206 713/340 |
| 2011/0137713 A1 | 6/2011 | Dalgas et al. | |
| 2011/0173329 A1 | 7/2011 | Zhang et al. | |
| 2011/0179132 A1 | 7/2011 | Mayo et al. | |
| 2011/0238340 A1 | 9/2011 | Dasgupta et al. | |
| 2011/0246147 A1 | 10/2011 | Rasmussen et al. | |
| 2011/0270795 A1 | 11/2011 | Smith et al. | |
| 2011/0282982 A1 | 11/2011 | Jain | |
| 2011/0307820 A1 | 12/2011 | Rasmussen et al. | |
| 2012/0005344 A1 | 1/2012 | Kolin et al. | |
| 2012/0133510 A1 | 5/2012 | Pierce et al. | |
| 2012/0232877 A1 | 9/2012 | Bhagwat et al. | |
| 2012/0239219 A1 | 9/2012 | Forbes | |
| 2012/0253710 A1 | 10/2012 | Lehmann et al. | |
| 2012/0259901 A1 | 10/2012 | Lee et al. | |
| 2012/0271935 A1 | 10/2012 | Moon | |
| 2013/0073245 A1 | 3/2013 | Bhagwat et al. | |
| 2013/0138252 A1 | 5/2013 | Chainer | |
| 2014/0011437 A1* | 1/2014 | Gosselin | H05K 7/20836 454/154 |

OTHER PUBLICATIONS

Modeling and Managing Thermal Profiles of Rack-mounted Servers with ThermoStat, Jeonghwan Choi, Youngjae Kim, Anand Sivasubramaniam, Jelena Srebric, Qian Wang, Joonwon Lee, 11 pages, 2007.

C-Oracle: Predictive Thermal Management for Data Centers, Luiz Ramos and Ricardo Bianchini, Technical Report DCS-TR-617, 13 pages, Sep. 2007.

Evaluation of air management system's thermal performance for superior cooling efficiency in high-density data centers, Energy and Buildings, Jinkyun Cho, Byungseon Sean Kim, 11 pages, Sep. 2011.

* cited by examiner

THERMAL CAPACITY MANAGEMENT

CROSS-REFERENCE TO RELATED APPLICATIONS

This application claims the benefit of U.S. Provisional Patent Application No. 61/873,632, filed on Sep. 4, 2013, which is incorporated herein by reference in its entirety.

FIELD OF INVENTION

Embodiment of the present invention generally relate to the field of thermal capacity management within data centers, and more specifically, to methods and systems which provide feedback based on thermal information associated with parts of a data center.

BACKGROUND

Data centers are often designed with a projected capacity, which is usually more than twice the capacity utilized in the first day of its operation. Consequently, over time, equipment within the data center gets updated, replaced, and added as necessitated by the operational needs. Given the changes which take place during the life of a data center, it is important to be aware of what locations can be considered safe for new equipment. The safety factor is not only dictated by the available rack unit (RU) spaces within cabinets, the cabinet weight limits, and power availability, but more importantly it is also dictated by the available cooling (thermal) capacity at a given cabinet.

Various systems direct to thermal capacity management have been developed. However, continued need by data center managers for new ways of evaluating thermal capacity of a data center and how electronic equipment impacts this capacity creates a need for new and improved systems and methods related to this field.

SUMMARY

Accordingly, at least some embodiment of the present invention are generally directed to systems and methods for providing feedback information based on thermal and power variables.

In an embodiment, the present invention is a method comprising the steps of using temperature measurements and power meter readings to provide a real-time capacity usage in a given data center.

In another embodiment, the present invention is a system for managing cooling capacity within a data center or within a subset of a data center, where the system includes at least one processor; and a computer readable medium connected to the at least one processor. The computer readable medium includes instructions for collecting information from a plurality of cabinets, the information including an inlet temperature, a maximum allowable cabinet temperature, and a supply air temperature, where the collected temperatures are used to calculate a value Theta for each of the plurality of cabinets. The computer readable medium further includes instructions for determining whether any of the calculated Theta values indicates that any of the plurality of cabinets' inlet temperatures is at least one of below, at, and above the respective maximum allowable cabinet temperature. The computer readable medium further includes instructions for determining whether, based on any of the calculated Theta values, performed cooling capacity management will satisfy a user confidence level, and if the confidence level is satisfied, for distributing the remaining cooling capacity over at the plurality of cabinets.

In yet another embodiment, the present invention is a non-transitory computer readable storage medium including a sequence of instructions stored thereon for causing a computer to execute a method for managing cooling capacity within a data center. The method includes collecting cabinet information from each of a plurality of cabinets, the cabinet information including an inlet temperature, a maximum allowable cabinet temperature, and a supply air temperature. The method also includes collecting a total power consumption for the plurality of cabinets. The method also includes collecting a total cooling capacity for the plurality of cabinets. The method also includes deriving a remaining cooling capacity for the plurality of cabinets. The method also includes for each of the plurality of cabinets calculating a $\theta$ value, each of the calculated $\theta$ values being calculated at least in part from the respective collected cabinet information. And the method also includes for each of the calculated $\theta$ values determining whether any one of the plurality of cabinets' the inlet temperatures is at least one of below, at, and above the respective maximum allowable cabinet temperatures, where if any one of the inlet temperatures is at least one of at and above the respective maximum allowable cabinet temperatures, providing a first alarm, and where if all of the inlet temperatures are below the respective maximum allowable cabinet temperatures, determining whether each of the calculated $\theta$ values is at least one of below, at, and above a user-defined $\theta$ value, where if any one of the calculated $\theta$ values is at least one of at and above the user-defined $\theta$ value, providing a second alarm, and where if all of the calculated $\theta$ values are below the user-defined $\theta$ value, distributing the remaining cooling capacity over the plurality of cabinets.

These and other features, aspects, and advantages of the present invention will become better-understood with reference to the following drawings, description, and any claims that may follow.

DETAILED DESCRIPTION

Figure 1:
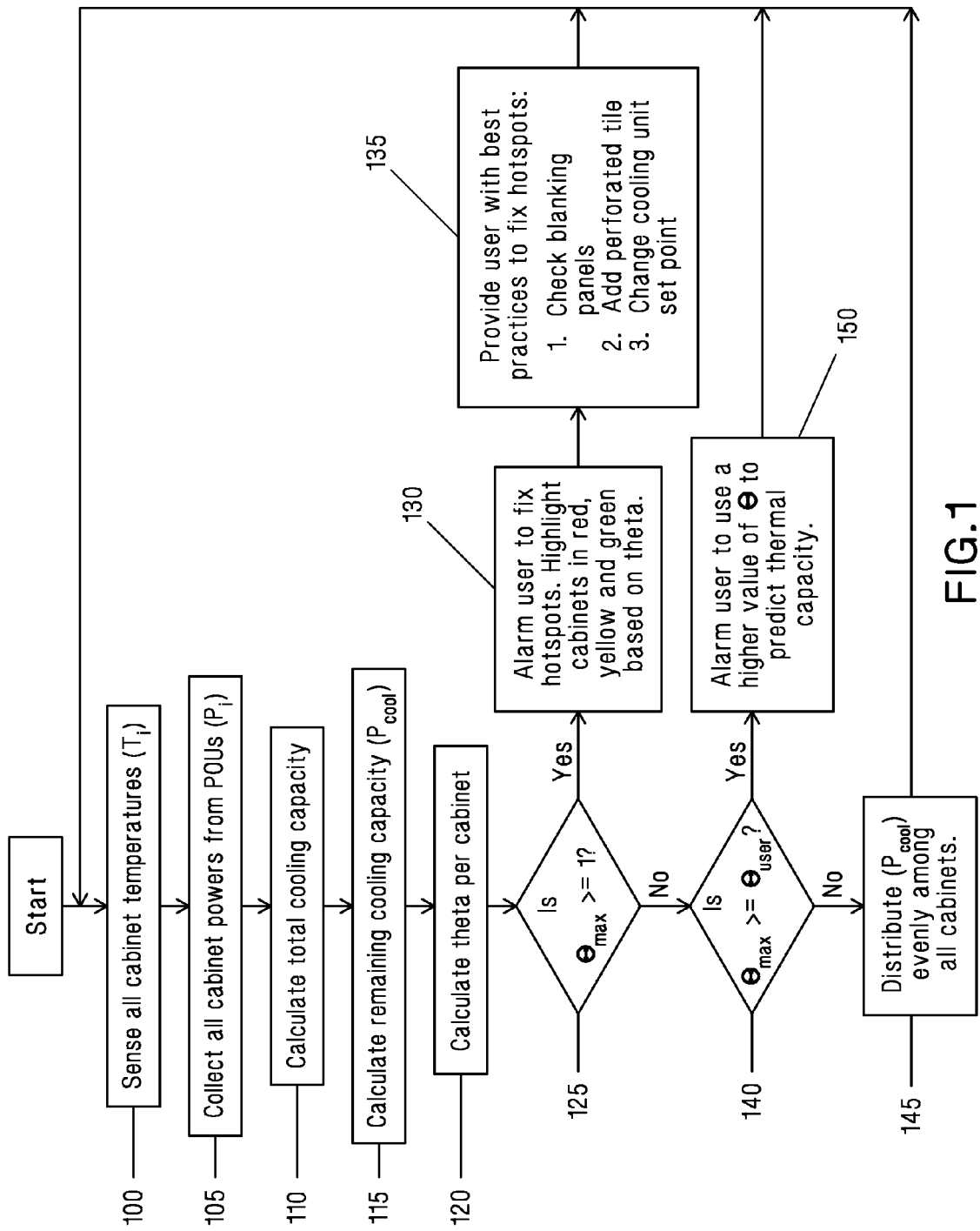
FIG. 1 illustrates a flow chart representative of an embodiment of the present invention.

Referring now to FIG. 1, this figure illustrates a flowchart showing the steps performed in one embodiment of the present invention. In the initial step 100, cabinet inlet temperatures $T_{max,i}$ are obtained from the available cabinets within the data center. This can be achieved by monitoring temperature sensors which are installed within the cabinets. While in instances where only one sensor is installed, only one temperature reading can be obtained, in instances where multiple sensors are installed in a cabinet, it is preferable to use the maximum recorded temperature for the $T_{max,i}$ value. Alternative, average values may be considered.

In the next step 105, power consumption values $P_i$ are obtained from the available cabinets. One way of obtaining the necessary real-time power readings is to collect power usage information from power outlet units (POUs) which are typically installed in data center cabinets. Each POU provides a total power usage reading for the respective cabinet.

Adding the available POU readings from each of the cabinets present within a data center or within a subset of a data center provides the total power usage value $\Sigma P_i$ for the respective data center or for a respective subset of that data center.

In the next step 110, the total cooling capacity of a data center or of a subset of a data center is calculated. This can be done by using manufacturer-supplied data, such as the rated capacity of the cooling equipment within the data center. Using this data, the rated capacity of the cooling equipment within the data center or within a subset of a data center are summed together and are used to obtain the total remaining cooling capacity available at the current specified cooling equipment set-point.

Having the total power usage, it is then possible to determine the remaining cooling capacity in step 115. To do this, the total power usage $\Sigma P_i$ calculated in step 105 is subtracted from the total cooling capacity calculated in step 110. The resulting $P_{cool}$ value.

Next, it is necessary to calculate a non-dimensional parameter Theta ($\theta$). This parameter is computed for at least one cabinet, and preferably for every cabinet in a data center or a subset of a data center. For every cabinet, Theta is calculated using the maximum inlet cabinet temperature $T_{max,i}$, maximum allowable temperature $T_{Allowable}$, and the supply air temperature $T_{SAT}$ of the air being supplied by the cooling equipment, where $\theta$ is derived using the following equation:

$$\theta = \frac{T_{max,i} - T_{SAT}}{T_{Allowable} - T_{SAT}}$$

The maximum allowable temperature $T_{Allowable}$ can be obtained either from the manufacturer's specification or this value may be set to any value deemed appropriate by the user. The supply air temperature $T_{SAT}$ of the air being supplied by the cooling equipment can be obtained by way of measuring said temperature at or near the equipment supplying the cooling air or at any position before the cabinet that is deemed to provide an accurate representation of the temperature of the air that is being supplied.

Theta can be described as the temperature gradient between the inlet temperature $T_{max,i}$ of each cabinet and the supply air temperature $T_{SAT}$, with respect to a maximum allowable temperature $T_{Allowable}$. A Theta value of zero indicates that the cabinet inlet temperature is at the supply air temperature (no gradient). A Theta value of one indicates that the cabinet inlet temperature is at the allowable temperature, and a value above one indicates a cabinet inlet temperature above the allowable temperature.

As shown in step 125, the calculated Theta value is used to determine the next course of action. If any one cabinet inlet temperature is at or above a set allowable temperature (evidenced by a Theta value being equal or greater than 1), the system determines that there is no additional cooling capacity available on any of the cabinets until the issue of the inlet temperature being higher than the allowable temperature is resolved to where the inlet temperature is lower than the allowable temperature. To notify the user of the potential risk of overheating, an alarm may be signaled to the user, as shown in step 130. This may be done in any number of suitable ways and can include electronic, visual, aural, or any other appropriate methods of delivery. In one embodiment, the user receives a message within data center management software used to manage the data center where the message provides a map-like representation of the data center with any of the problematic cabinets being highlighted a certain color. In a variation of this embodiment all the cabinets may be highlighted such that any cabinet having Theta≥1 appears red, any cabinet having 1>Theta>0 appears yellow, and any cabinet having Theta=0 appears green. Once the user has received an alarm, he may undertake the necessary action to remedy the problem. As illustrated in step 135, the present invention may provide the user with potential ways to fix the issues causing the alarm. This may include, without limitations, suggestions to check the blanking panels, add perforated tiles, and/or change the cooling unit set-point.

Figure 2:
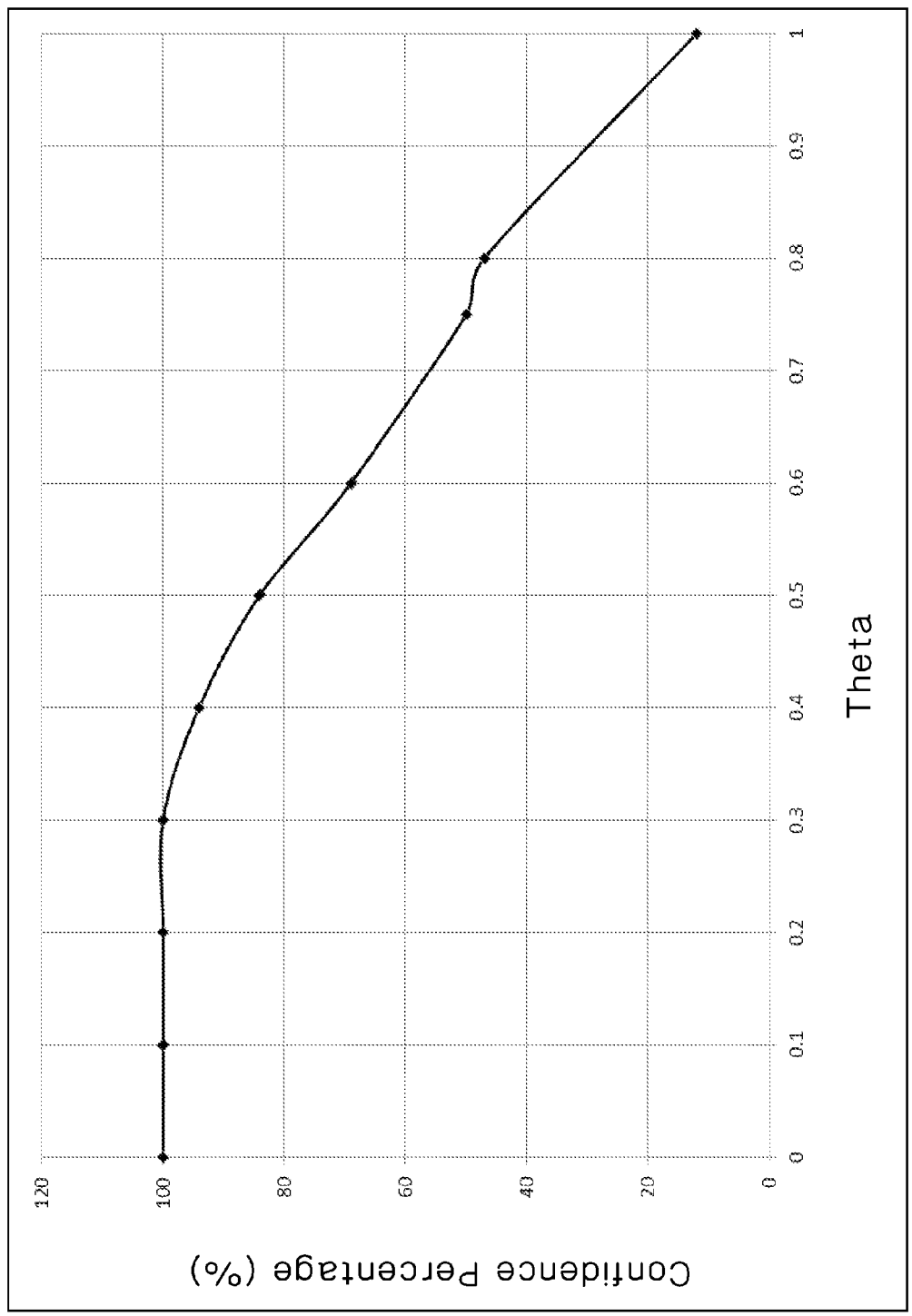
FIG. 2 illustrates the correlation between a confidence percentage and a Theta value.

If all the cabinet inlet temperatures are below the allowable temperature (evidenced by having all the calculated Theta values remain below 1), the present invention compares the calculated Theta values against a predefined $\theta_{user}$ value. The $\theta_{user}$ value corresponds to a specific user-confidence percentage, and the predefined correlation between the two is derived through a number of Computational Fluid Dynamics (CFD) models that are representative of actual data centers (as explained later in the specification). The plot in FIG. 2 shows the confidence value in the cooling capacity management method used for different theta values. If, for example, the user specified Theta ($\theta_{user}$) is 0.3 or below, the cooling capacity management method represented by the flow chart of FIG. 1 is likely to work 100% of the time, keeping a safe thermal environment for the IT equipment. However if the $\theta_{user}$ is 0.6, the cooling capacity management method represented by the flow chart of FIG. 1 is likely to work 70% of the time. Note that if and when a certain confidence level is selected, such a level correlates to the highest possible value of $\theta_{user}$ that will still correspond to the selected confidence level. Therefore, for example, if a confidence level of 100% is selected, the $\theta_{user}$ value used in the execution of the present invention will be 0.3 instead of 0.1.

Thus, if in step 140 it is determined that the calculated Theta values for a set of cabinets or all the cabinets within a data center fall below a predefined value $\theta_{user}$, the present invention distributes the remaining cooling capacity $P_{cool}$ over said cabinets in step 145 and provides the user with a confidence percentage that the executed distribution will successfully work. If, however, any of the calculated Theta values are equal to or greater than $\theta_{user}$, the present invention outputs an alarm (similar to the alarm of step 130) in step 150. This alarm can signal to the user that the cooling capacity management in accordance with the present invention would not achieve the sufficient confidence percentage.

Note that the predefined $\theta_{user}$ value can be set by the user by way of selecting a desired confidence level, wherein based on the selected confidence level, the present invention determines the appropriate $\theta_{user}$ value. Thus, if the user had determined that the appropriate confidence percentage was at no less than ~85%, the present invention would translate that percentage into a $\theta_{user}$ value of 0.4 and use that value in step 140.

As noted previously, the correlation between the $\theta_{use}$ value and the confidence level is developed via a number of Computational Fluid Dynamics (CFD) models that are representative of real data centers. The CFD models are ran for different conditions, changing a number of key variables such as: supply air temperature, cabinet power, and different types of IT equipment. For each case, the CFD models are ran with different air ratios (AR). In an embodiment, there ranges are from 0.8 AR to 2 AR. Air ratio is defined as the ratio between the airflow supplied by the cooling units and the total airflow required for the IT equipment.

For each CFD run, the maximum cabinet inlet temperatures are monitored. If a cabinet maximum inlet temperature exceeds a specified allowable temperature, thermal capacity is not managed. If all cabinet inlet temperatures are below the allowable temperatures, capacity is managed by distributing the available cooling capacity among all the cabinets equally. The model is then rerun using the new managed capacity for different ARs. Theta is calculated per cabinet for the baseline run with the minimum AR that provided safe cabinet inlet temperatures. The maximum Theta value is used for the percent confidence value in the present invention.

This work is repeatedly done for the remaining CFD models at different cases. The maximum Theta values are collected to provide the overall percent confidence in the present invention. The percent confidence is a way of providing the user with a barometer for confidence for the approach used for capacity management among the cabinets, for a given set of theta values in their data center.

Figure 3:
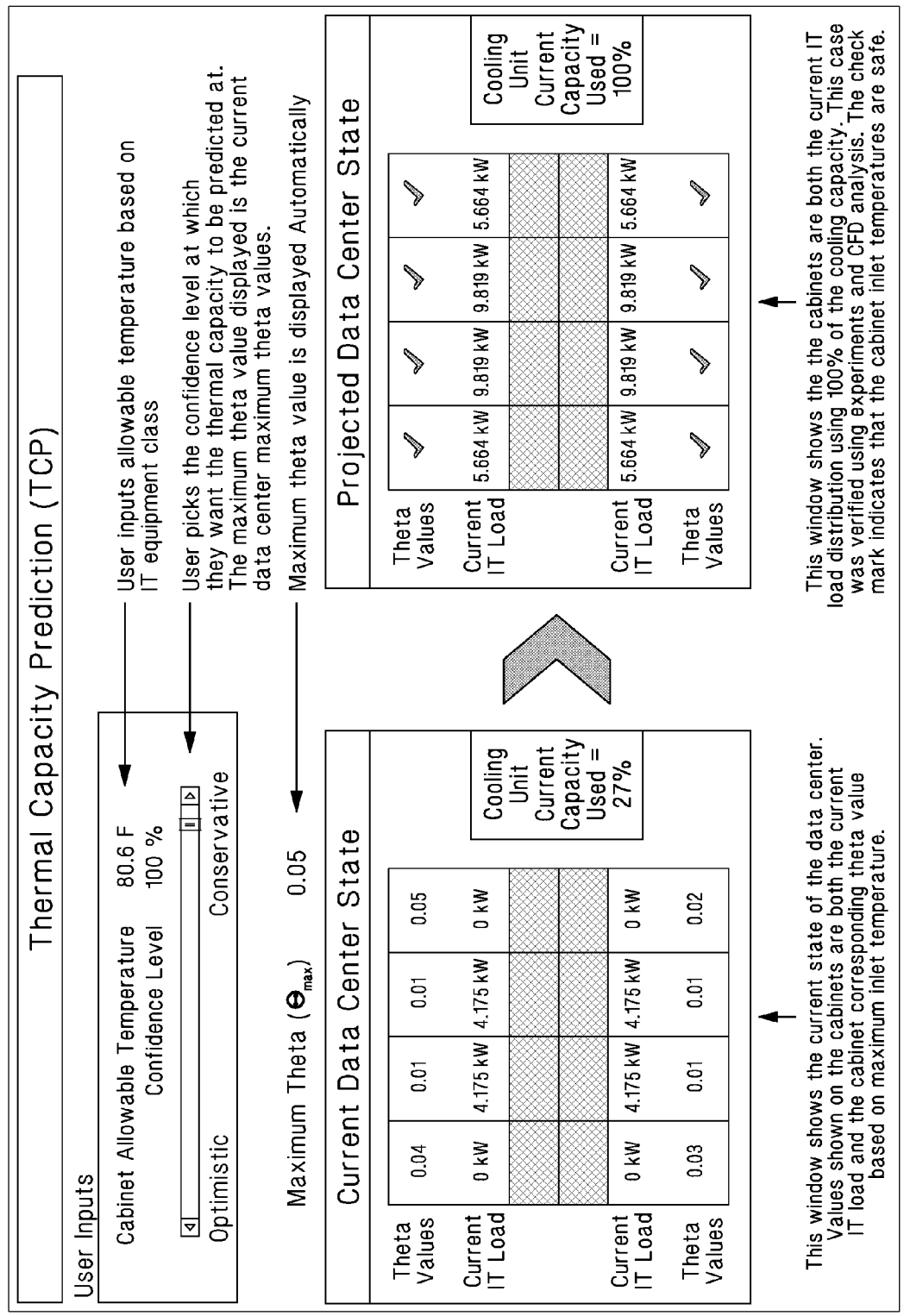
FIG. 3 illustrates an executed embodiment of the present invention.

An example of the how a system in accordance with the present invention may be used is shown in FIG. 3. This figure illustrates two data center layouts (one being the current layout and one being the projected layout) and provides a user input interface where the user may select a particular confidence level. In the currently described embodiment the selection of the confidence level is done by way of a slider which ranges from "optimistic" to "conservative" with "conservative" being most confident and "optimistic" being least confident. However, a particular confidence level may be inputted in any number of ways, including without limitation manual entry of a number or automatic entry based on at least one other factor. Having the necessary temperature values, the system calculates the maximum Theta value to be 0.05. Given that this value is below 1, the present invention proceeds to the next step without triggering an alarm. The 0.05 Theta value is then compared to the $\theta_{user}$ value which is derived from the selected confidence level percentage. In the described embodiment, the selected confidence level percentage is ~100%, which translates to a $\theta_{user}$ value of 0.3. Since the maximum Theta is not greater than or equal to $\theta_{user}$ value, the system proceeds, yet again without triggering an alarm, to distribute the remaining cooling capacity evenly over all the cabinets under consideration. In this case, the remaining cooling capacity is distributed evenly, and thus each cabinet receives an additional 5.73 kw of cooling capacity. In alternate embodiments, alternate distribution schemes may be implemented.

Note that the mention of the "data center" should not be interpreted as referring only to an entire data center, as it may refer only to a subset of a data center. Accordingly, references to a "data center" throughout this application and the claims may be understood to refer to the entire data center and/or to a subset of a data center.

Embodiment of the present invention may be implemented using at least one computer. At least some of the operations described above may be codified in computer readable instructions such that these operations may be executed by the computer. The computer may be a stationary device (e.g., a server) or a portable device (e.g., a laptop). The computer includes a processor, memory, and one or more drives or storage devices. The storage devices and their associated computer storage media provide storage of computer readable instructions, data structures, program modules and other non-transitory information for the computer. Storage devices include any device capable of storing non-transitory data, information, or instructions, such as: a memory chip storage including RAM, ROM, EEPROM, EPROM or any other type of flash memory device; a magnetic storage device including a hard or floppy disk, and magnetic tape; optical storage devices such as a CD-ROM disc, a BD-ROM disc, and a BluRay™ disc; and holographic storage devices.

The computer may operate in a networked environment using logical connections to one or more remote computers, such as a remote computer. The remote computer may be a personal computer, a server, a router, a network PC, a peer device or other common network node, and may include many if not all of the elements described above relative to computer. Networking environments are commonplace in offices, enterprise-wide computer networks, intranets and the Internet. For example, in the subject matter of the present application, a computer may comprise the source machine from which data is being migrated, and the remote computer may comprise the destination machine. Note, however, that source and destination machines need not be connected by a network or any other means, but instead, data may be migrated via any media capable of being written by the source platform and read by the destination platform or platforms. When used in a LAN or WLAN networking environment, a computer is connected to the LAN through a network interface or an adapter. When used in a WAN networking environment, a computer typically includes a network interface card or other means for establishing communications over the WAN to environments such as the Internet. It will be appreciated that other means of establishing a communications link between the computers may be used.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Note that while this invention has been described in terms of several embodiments, these embodiments are non-limiting (regardless of whether they have been labeled as exemplary or not), and there are alterations, permutations, and equivalents, which fall within the scope of this invention. Additionally, the described embodiments should not be interpreted as mutually exclusive, and should instead be understood as potentially combinable if such combinations are permissive. It should also be noted that there are many alternative ways of implementing the methods and apparatuses of the present invention. It is therefore intended that claims that may follow be interpreted as including all such alterations, permutations, and equivalents as fall within the true spirit and scope of the present invention.

We claim:

1. A non-transitory computer readable storage medium including a sequence of instructions stored thereon for causing a computer to execute a method for managing cooling capacity within a data center, said method comprising the steps of:
    collecting cabinet information from each of a plurality of cabinets, said cabinet information including an inlet temperature, a maximum allowable cabinet temperature, and a supply air temperature;
    collecting a total power consumption for said plurality of cabinets;
    collecting a total cooling capacity for said plurality of cabinets;
    deriving a remaining cooling capacity for said plurality of cabinets;
    for each of said plurality of cabinets calculating a θ value, each of said calculated θ values being calculated at least in part from said respective collected cabinet information; and
    for each of said calculated θ values determining whether any one of said plurality of cabinets' said inlet temperatures is at least one of below, at, and above said respective maximum allowable cabinet temperatures, where:
        if any one of said inlet temperatures is at least one of at and above said respective maximum allowable cabinet temperatures, providing a first alarm, and where
        if all of said inlet temperatures are below said respective maximum allowable cabinet temperatures, determining whether each of said calculated θ values is at least one of below, at, and above a user-defined θ value, where:
            if any one of said calculated θ values is at least one of at and above said user-defined θ value, providing a second alarm, and where
            if all of said calculated θ values are below said user-defined θ value, distributing said remaining cooling capacity over said plurality of cabinets.

2. The non-transitory computer-readable medium of claim 1, wherein said distributing said remaining cooling capacity over said plurality of cabinets includes evenly distributing said remaining cooling capacity over said plurality of cabinets.

3. The non-transitory computer-readable medium of claim 1, wherein said user-defined θ value corresponds to a confidence percentage.

4. The non-transitory computer-readable medium of claim 3, wherein said confidence percentage corresponds to a level of confidence that said distribution of said remaining cooling capacity over said plurality of cabinets will satisfy a projected state for said data center.

5. The non-transitory computer-readable medium of claim 3, wherein said confidence percentage is less than 100% for user-defined θ values greater than 0.3.

6. The non-transitory computer-readable medium of claim 1, wherein said step of collecting said total power consumption for said plurality of cabinets includes monitoring a power outlet unit for each of said plurality of cabinets.

7. The non-transitory computer-readable medium of claim 1, wherein said step of collecting said inlet temperature for each of said plurality of cabinets includes monitoring at least one temperature sensor for each of said plurality of cabinets.

8. The non-transitory computer-readable medium of claim 1, wherein each of said θ values is calculated via $$\theta = \frac{T_{max,i} - T_{SAT}}{T_{Allowable} - T_{SAT}}$$

where:
    $T_{max,i}$ is said respective inlet temperature,
    $T_{SAT}$ is said respective supply air temperature, and
    $T_{Allowable}$ is said respective maximum allowable cabinet temperature.

9. A system for managing cooling capacity within a data center, said system comprising:
    at least one processor; and
    a non-transitory computer readable medium connected to said at least one processor, said non-transitory computer readable medium includes instructions for:
    collecting cabinet information from each of a plurality of cabinets, said cabinet information including an inlet temperature, a maximum allowable cabinet temperature, and a supply air temperature;
    collecting a total power consumption for said plurality of cabinets;
    collecting a total cooling capacity for said plurality of cabinets;
    deriving a remaining cooling capacity for said plurality of cabinets;
    for each of said plurality of cabinets calculating a θ value, each of said calculated θ values being calculated at least in part from said respective collected cabinet information; and
    for each of said calculated θ values determining whether any one of said plurality of cabinets' said inlet temperatures is at least one of below, at, and above said respective maximum allowable cabinet temperatures, where:
        if any one of said inlet temperatures is at least one of at and above said respective maximum allowable cabinet temperatures, providing a first alarm, and where
        if all of said inlet temperatures are below said respective maximum allowable cabinet temperatures, determining whether each of said calculated θ values is at least one of below, at, and above a user-defined θ value, where:
            if any one of said calculated θ values is at least one of at and above said user-defined θ value, providing a second alarm, and where
            if all of said calculated θ values are below said user-defined θ value, distributing said remaining cooling capacity over said plurality of cabinets.

10. The system of claim 9, wherein said distributing said remaining cooling capacity over said plurality of cabinets includes evenly distributing said remaining cooling capacity over said plurality of cabinets.

11. The system of claim 9, wherein said user-defined θ value corresponds to a confidence percentage.

12. The system of claim 11, wherein said confidence percentage corresponds to a level of confidence that said distribution of said remaining cooling capacity over said plurality of cabinets will satisfy a projected state for said data center.

13. The system of claim 11, wherein said confidence percentage is less than 100% for user-defined θ values greater than 0.3.

14. The system of claim 9, wherein said collecting said total power consumption for said plurality of cabinets includes monitoring a power outlet unit for each of said plurality of cabinets.

15. The system of claim 9, wherein said collecting said inlet temperature for each of said plurality of cabinets includes monitoring at least one temperature sensor for each of said plurality of cabinets.

16. The system of claim 9, wherein each of said θ values is calculated via $$\theta = \frac{T_{max,i} - T_{SAT}}{T_{Allowable} - T_{SAT}}$$

where:
 $T_{max,i}$ is said respective inlet temperature,
 $T_{SAT}$ is said respective supply air temperature, and
 $T_{Allowable}$ is said respective maximum allowable cabinet temperature.

* * * * *